(12) United States Patent
Ahn et al.

(10) Patent No.: US 8,318,533 B2
(45) Date of Patent: Nov. 27, 2012

(54) METHOD OF MANUFACTURING AN ORGANIC THIN FILM TRANSISTOR

(75) Inventors: Taek Ahn, Suwon-si (KR); Min-Chul Suh, Suwon-si (KR); Jae-Bon Koo, Suwon-si (KR); Jin-Seong Park, Suwon-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 235 days.

(21) Appl. No.: 12/662,192

(22) Filed: Apr. 5, 2010

(65) Prior Publication Data

US 2010/0197085 A1  Aug. 5, 2010

Related U.S. Application Data

(62) Division of application No. 11/282,633, filed on Nov. 21, 2005, now Pat. No. 7,719,496.

(30) Foreign Application Priority Data

Nov. 23, 2004 (KR) .................. 10-2004-0096210
Oct. 24, 2005 (KR) .................. 10-2005-0100278
Nov. 3, 2005 (KR) .................. 10-2005-0104925

(51) Int. Cl.
*H01L 51/40* (2006.01)
*H01L 21/00* (2006.01)
*H01L 21/44* (2006.01)
(52) U.S. Cl. .... 438/99; 438/158; 438/677; 257/E51.006
(58) Field of Classification Search .................. 438/99, 438/158, 677; 257/E51.006
See application file for complete search history.

(56) References Cited

U.S. PATENT DOCUMENTS

| | | | |
|---|---|---|---|
| 6,992,324 B2 | 1/2006 | Nagayama | |
| 7,081,640 B2 | 7/2006 | Uchida et al. | |
| 7,170,088 B2 | 1/2007 | Koo et al. | |
| 7,291,969 B2 | 11/2007 | Tsutsui | |
| 7,692,185 B2 * | 4/2010 | Suh et al. | 257/40 |
| 2003/0059975 A1* | 3/2003 | Sirringhaus et al. | 438/99 |
| 2003/0137557 A1* | 7/2003 | Nakamura | 347/44 |
| 2004/0085014 A1* | 5/2004 | Park et al. | 313/504 |
| 2004/0150319 A1* | 8/2004 | Tomimatsu et al. | 313/495 |
| 2005/0282308 A1* | 12/2005 | Uhlig et al. | 438/99 |
| 2005/0285509 A1* | 12/2005 | Funamoto et al. | 313/504 |

FOREIGN PATENT DOCUMENTS

| | | |
|---|---|---|
| CN | 147633 | 2/2004 |
| CN | 1476111 | 2/2004 |
| CN | 1495931 | 5/2004 |
| CN | 1905230 | 1/2007 |
| JP | 04-069971 | 3/1992 |
| JP | 07-022670 | 1/1995 |
| JP | 2003-324202 | 11/2003 |

(Continued)

*Primary Examiner* — Kevin Parendo
(74) *Attorney, Agent, or Firm* — Robert E. Bushnell, Esq.

(57) ABSTRACT

An organic thin film transistor that has good adhesiveness and good contact resistance as well as allows ohmic contact between an organic semiconductor layer and a source electrode and a drain electrode, and its manufacturing method. There is also provided a flat panel display device using the organic thin film transistor. The organic thin film transistor includes a source electrode, a drain electrode, an organic semiconductor layer, a gate insulating layer, and a gate electrode formed on a substrate, and a carrier relay layer including conductive polymer material formed at least between the organic semiconductor layer and the source electrode or the organic semiconductor layer and the drain electrode.

12 Claims, 11 Drawing Sheets

FOREIGN PATENT DOCUMENTS

| | | |
|---|---|---|
| JP | 2004-103905 | 4/2004 |
| JP | 2004-327829 | 11/2004 |
| KR | 10-2004-0067047 | 7/2004 |
| KR | 10-2005-0104811 | 11/2005 |
| KR | 10-2006-0019977 | 3/2006 |
| KR | 10-2006-0049062 | 5/2006 |
| KR | 10-2006-0055053 | 5/2006 |
| KR | 10-2006-0055762 | 5/2006 |
| KR | 10-2006-0084122 | 7/2006 |
| KR | 10-2006-0098002 | 9/2006 |

\* cited by examiner

METHOD OF MANUFACTURING AN ORGANIC THIN FILM TRANSISTOR

CLAIM OF PRIORITY AND CROSS-REFERENCE TO RELATED APPLICATION

This application makes reference to, incorporates the same herein, and claims all benefits accruing under 35 U.S.C. §119 from an applications earlier filed in the Korean Intellectual Property Office on 23 Nov. 2004, 24 Oct. 2005, and 3 Nov. 2005 and there duly assigned Serial Nos. 10-2004-0096210, 10-2005-0100278, and 10-2005-0104925, respectively. Furthermore, as per 35 U.S.C. §120, this application is a divisional of Applicants' Ser. No. 11/282,633 filed in the U.S. Patent & Trademark Office on 21 Nov. 2005, now U.S. Pat. No. 7,719,496 issued May 18, 2010, and assigned to the assignee of the present invention.

BACKGROUND OF THE INVENTION

1. Field of the Invention

The present invention relates to an organic thin film transistor, a method of manufacturing the same, and a flat panel display device with the same, and more particularly, to an organic thin film transistor with an improved structure, a method of manufacturing the same, and a flat panel display device with the same.

2. Description of the Related Art

Generally, a silicon thin film transistor includes a source region and a drain region doped with high-density impurities, a semiconductor layer having a channel region formed between the source region and the drain region, a source electrode connected to the source region, and a drain electrode connected to the drain region. Such silicon thin film transistor has disadvantages in that the manufacturing cost is high, and it can be easily broken by external impact, and it cannot be formed on a flexible plastic substrate because formation thereof requires a high temperature process of over 300° C.

Unlike the silicon thin film transistor, an organic thin film transistor (OTFT) using an organic semiconductor layer can be formed on a plastic substrate, etc., because it can be manufactured at the room temperature. Since the organic thin film transistor can be used in various devices such as flexible display devices, smart cards, inventory tags, and price tags, OTFTs are being vigorously developed. However, since the organic thin film transistor can not separately form a region doped with high density impurities, it has a disadvantage in that the contact resistance between an organic semiconductor layer and a source and drain electrodes is high.

In the meantime, the source electrode and the drain electrode of the organic thin film transistor are made of noble metals such as gold (Au), platinum (Pt), palladium (Pd), etc. to form an ohmic contact. However, such noble metals for the source and drain electrodes are expensive. In addition, since their adhesiveness to the organic semiconductor layer is poor, there is a high probability of failure and there is a short life span. Moreover, since such noble metals have very poor adhesiveness also to a gate insulating layer, a separate adhesive layer is additionally required. What is needed is an improved design for an OTFT, and display using the same and an improved method of making that overcomes these problems.

SUMMARY OF THE INVENTION

It is therefore an object of the present invention to provide an improved organic thin film transistor.

It is also an object of the present invention to provide a method of making the organic thin film transistor.

It is further an object of the present invention to provide a display that employs the organic thin film transistor.

It is yet an object of the present invention to provide an organic thin film transistor which has good adhesiveness, good contact resistance as well as allows ohmic contact between an organic semiconductor layer and a source electrode and a drain electrode, and a manufacturing method thereof and a flat panel display device using the organic thin film transistor.

According to one aspect of the present invention, an organic thin film transistor includes a source electrode, a drain electrode, an organic semiconductor layer, a gate insulating layer, a gate electrode and a carrier relay layer arranged at least between the organic semiconductor layer and the source electrode or between the organic semiconductor layer and the drain electrode, the carrier relay layer comprising a conductive polymer material.

The carrier relay layer can include a material selected from the group consisting of polyethylenedioxythiophene and polyaniline. The carrier relay layer either has work function of between a work function of the organic semiconductor layer and a work function of the source electrode, or has work function of between the work function of the organic semiconductor layer and a work function of the drain electrode. A thickness of the carrier relay layer is in the range of 10 Å to 100 Å. A resistivity of the carrier relay layer is in the range of $10^5$ Ωcm to $10^{14}$ Ωcm. The carrier relay layer is arranged corresponding to at least one of the source electrode and the drain electrode. The carrier relay layer can be arranged on a top surface of at least one of the source electrode and the drain electrode. The carrier relay layer can be arranged to cover an entire portion of an exposed surface of at least one of the source electrode and the drain electrode.

The carrier relay layer can include a first carrier relay layer arranged between the organic semiconductor layer and the source electrode, and a second carrier relay layer arranged between the organic semiconductor layer and the drain electrode, the first carrier relay layer and the second carrier relay layer being spaced apart from each other. The carrier relay layer arranged between the organic semiconductor layer and the source electrode and the carrier relay layer arranged between the organic semiconductor layer and the drain electrode can be integrally formed. The carrier relay layer can be patterned to correspond to one organic thin film transistor. The source electrode or the drain electrode can each include a material selected from the group consisting of Ti, Cr, Al and MoW.

The organic semiconductor layer includes at least one material selected from the group consisting of pentacene, tetracene, anthracene, naphthalene, flullerene, alpha-6-thiophene, alpha-4-thiophene, oligothiophene, perylene and its derivative, rubrene and its derivative, coronene and its derivative, perylene tetracarboxylic diimide and its derivative, perylene tetracarboxylic dianhydride and its derivative, polythiophene and its derivative, polyparaphenylenevinylene and its derivative, polyparaphenylene and its derivative, polyfluorene and its derivative, polythiophenevinylene and its derivative, polythiophene-heterocyclic aromatic copolymer and its derivative, oligoacene of naphthalene and its derivative, naphthalene tetra carboxylic acid diimide and its derivative, oligothiophene of alpha-5-thiophene and its derivative, phthalocyanines with or without metal and their derivatives, pyromellitic dianhydride and its derivative, pyromellitic diimide and its derivative, polyalkylthiophene, polythienylenevinylene, alkylfluorene unit, and copolymer of alkylthiophene.

The organic thin film transistor can also include a hydrophobic layer arranged at least between the organic semiconductor layer and the source electrode or between the organic semiconductor layer and the drain electrode. The carrier relay layer is arranged in a same layer as the hydrophobic layer, the carrier relay layer being adapted to fill in openings in the hydrophobic layer. The carrier relay layer can include a first carrier relay layer arranged between the organic semiconductor layer and the source electrode, and a second carrier relay layer arranged between the organic semiconductor layer and the drain electrode, the first carrier relay layer can be arranged to cover a portion of the source electrode closest to the drain electrode, the second carrier relay layer can be arranged to cover a portion of the drain electrode closest to the source electrode.

The carrier relay layer can be arranged on a portion of a top surface of at least one of the source electrode or the drain electrode. The carrier relay layer can be arranged covering an entire portion of an exposed surface of at least one of the source electrode and the drain electrode. The hydrophobic layer can include a surface treatment agent comprising a self-assembled monolayer having one to three of hydrophobic moiety, one to three of reactive halogen atoms or alkoxy moiety, and silane moiety. The surface treatment agent of the hydrophobic layer can include a hydrophobic self-assembled monolayer having trichlorosilanyl moiety or trialkoxysilanyl moiety at its terminal end. The hydrophobic layer may include octadecyltrichlorosilane. The carrier relay layer can include a material selected from the group consisting of polyethylenedioxythiophene and polyaniline.

The present invention also contemplates a method of manufacturing an organic thin film transistor, including forming a conductive polymer material layer on an entire surface of a substrate, and patterning the conductive polymer material layer by laser ablation technology to form a carrier relay layer, the carrier relay layer being arranged at least between an organic semiconductor layer and a source electrode or between the organic semiconductor layer and a drain electrode.

The present invention also contemplates a another method of manufacturing an organic thin film transistor, including forming a hydrophobic material layer on an entire surface of a substrate, forming an opening in the hydrophobic material layer and forming a carrier relay layer in the opening, the carrier relay layer being arranged at least between an organic semiconductor layer and a source electrode or between the organic semiconductor layer and a drain electrode, the carrier relay layer comprising a conductive polymer material. The hydrophobic material layer can be produced by a process selected from the group consisting of spin coating and dipping. The opening in the hydrophobic material layer can be produced by a laser beam scanning process. The method further can include removing remaining conductive polymer material from between the source electrode and the drain electrode after the forming the carrier relay layer in the opening. The method can also include removing remaining conductive polymer material from between the source electrode and the drain electrode and can be achieved by a process selected from the group consisting of laser beam, ultraviolet ray, or electron beam scanning.

The present invention also contemplates a flat panel display device that includes a substrate, and an organic thin film transistor arranged on the substrate, the organic thin film transistor including a source electrode, a drain electrode, an organic semiconductor layer, a gate insulating layer, a gate electrode, and a carrier relay layer arranged at least between the organic semiconductor layer and the source electrode or between the organic semiconductor layer and the drain electrode, the carrier relay layer comprises a conductive polymer material.

The carrier relay layer can include a material selected from the group consisting of polyethylenedioxythiophene and polyaniline. A thickness of the carrier relay layer is in the range of 10 Å to 100 Å. A resistivity of the carrier relay layer is in the range of $10^5$ Ωcm to $10^{14}$ Ωcm. The display device can also include a hydrophobic layer arranged at least between the organic semiconductor layer and the source electrode or between the organic semiconductor layer and the drain electrode. The carrier relay layer is arranged on a same level as the hydrophobic layer, the carrier relay layer being arranged in openings in the hydrophobic layer. The hydrophobic layer can include a surface treatment agent having a self-assembled monolayer having one to three of hydrophobic moiety, one to three of reactive halogen atoms or alkoxy moiety, and silane moiety. The surface treatment agent of the hydrophobic layer can include a hydrophobic self-assembled monolayer having trichlorosilanyl moiety or trialkoxysilanyl moiety at its terminal end. The hydrophobic layer can include octadecyltrichlorosilane. The display device can also include an organic light emitting device electrically connected to the organic thin film transistor, the organic light emitting device includes a first electrode, an organic light emitting layer, and a second electrode. The display device can include a plurality of organic thin film transistors, the carrier relay layer being integrally provided to the plurality of organic thin film transistors.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
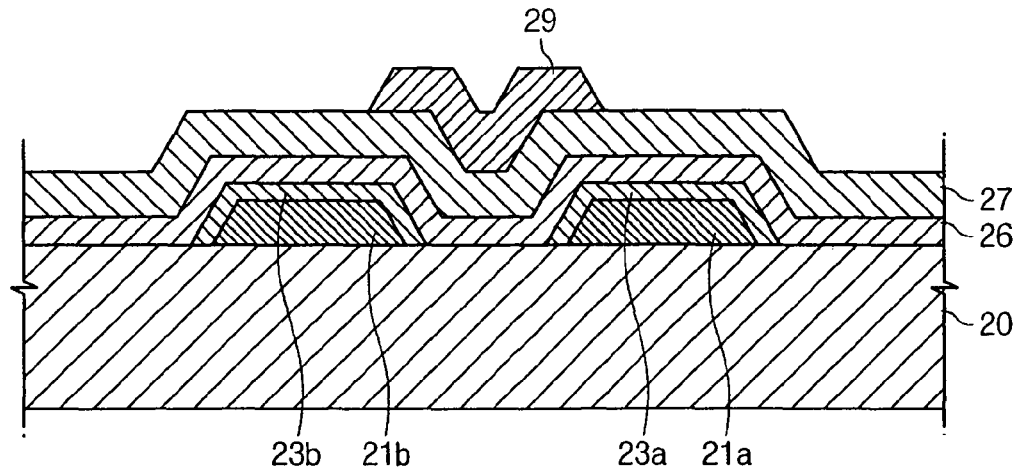
FIG. 1 is a cross sectional view of an organic thin film transistor according to the first embodiment of the present invention.

Turning now to the figures, FIG. 1 is a cross sectional view of an organic thin film transistor according to the first embodiment of the present invention. As shown in FIG. 1, a source electrode 21a and a drain electrode 21b are formed on a substrate 20, and carrier relay layers 23a and 23b and an organic semiconductor layer 26 are sequentially formed covering the source electrode 21a and the drain electrode 21b. Accordingly, the carrier relay layers 23a and 23b are located between the source and drain electrodes 21a and 21b and the organic semiconductor layer 26. A gate insulating layer 27 is formed covering the organic semiconductor layer 26, and a gate electrode 29 is formed on the gate insulating layer 27 between the source and drain electrodes 21a and 21b.

The details of the organic thin film transistor of FIG. 1 are as follows. The substrate 20 can be made of glass, silicon, plastic, or metal. The plastic can be polyethylene terephthalate (PET), polyethylene naphtahlate (PEN), polyether sulfone (PES), polyether imide, polyphenylene sulfide (PPS), polyallyate, polyimide, polycarbonate (PC), cellulose triacetate, cellulose acetate propionate (CAP), etc.

The source electrode 21a and the drain electrode 21b can be made of metal with the different work function from that of organic semiconductor layer 26. For example, if the organic semiconductor layer 26 is p-type, it is made of material with work function of 5.0 eV or more. Accordingly, the source electrode 21a and the drain electrode 21b can be made of metal with work function of less than 5.0 eV, and is preferably made out of either Ti, Cr, Al or MoW.

Alternatively, the source electrode 21a and the drain electrode 21b can be made of transparent material such as indium tin oxide (ITO), indium zinc oxide (IZO), ZnO or $In_2O_3$, etc. This is because when the organic thin film transistor is electrically connected to a transparent pixel electrode (not shown in the drawing) of a flat display panel device described below, it allows the pixel electrode and the source and drain electrodes 21a and 21b to be integrally formed. Then, the reason why the pixel electrode is transparent is to transmit generated light.

The carrier relay layers 23a and 23b are made of material having work function between that of the organic semiconductor layer 26 and that of the source and drain electrodes 21a and 21b. Such carrier relay layers 23a and 23b separate the energy barrier between the organic semiconductor layer 26 and the source and drain electrodes 21a and 21b into smaller energy barriers. A cascade effect in accordance therewith facilitates hole injection from the source and drain electrodes 21a and 21b into the organic semiconductor layer 26 to thus form an ohmic contact.

Figure 2:
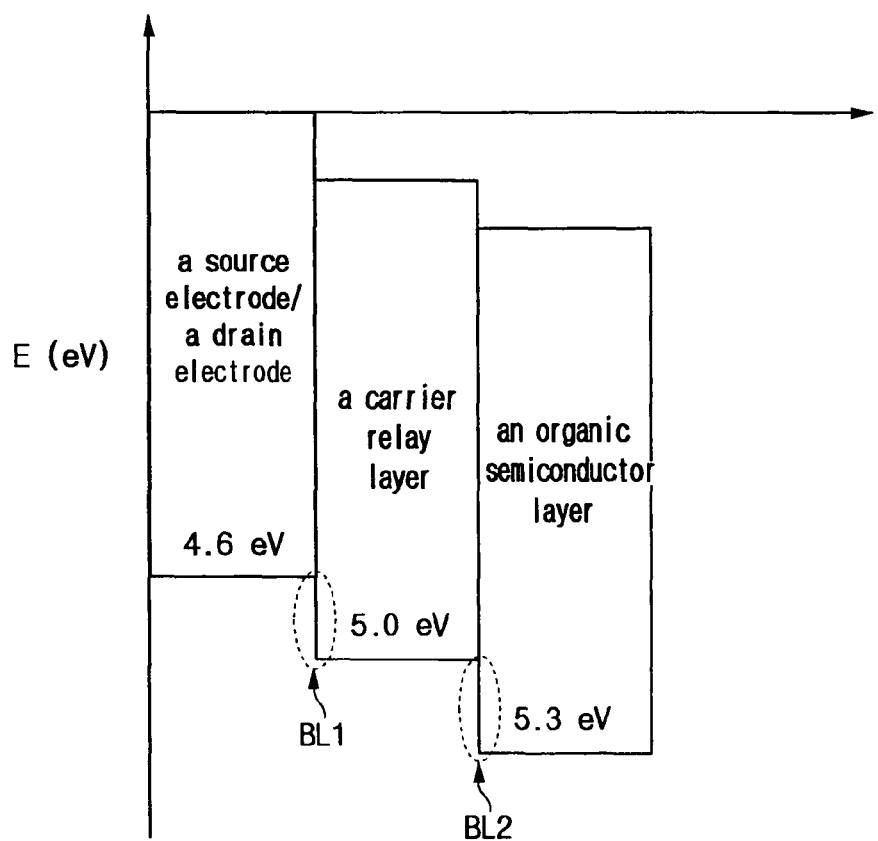
FIG. 2 is a drawing illustrating energy barriers of an organic thin film transistor with a carrier relay layer.
Figure 3:
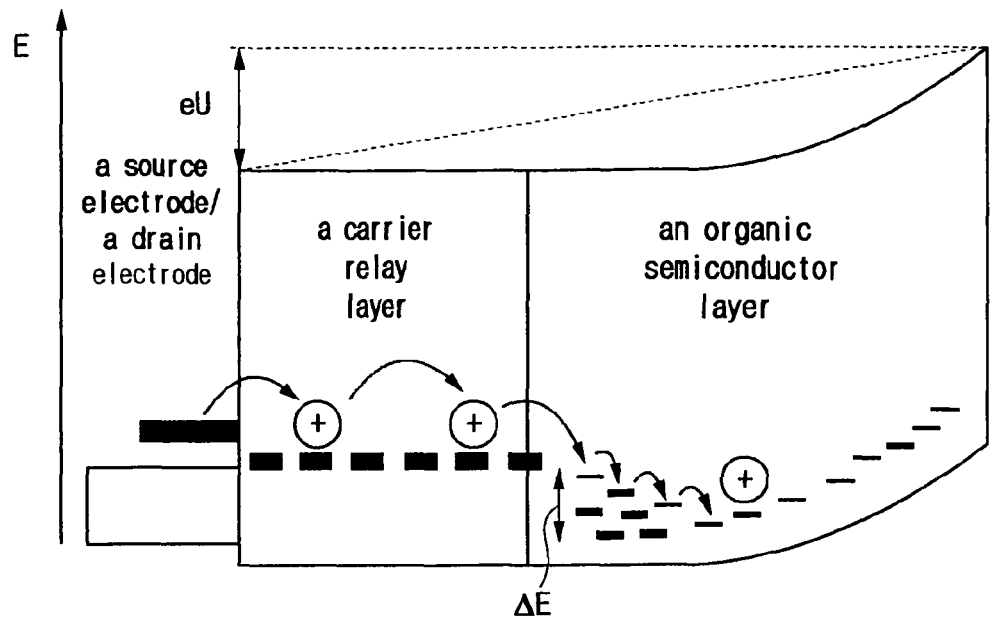
FIG. 3 is an energy band diagram of an organic thin film transistor with a carrier relay layer.
Figure 4:
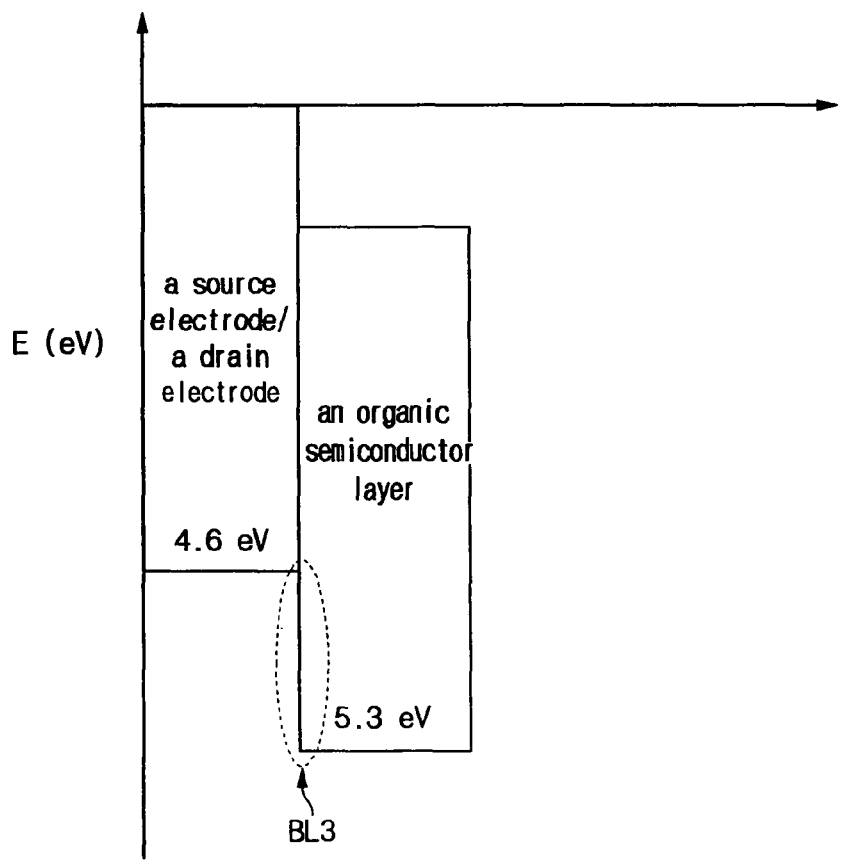
FIG. 4 is a drawing illustrating an energy barrier of an organic thin film transistor without a carrier relay layer.

Turning now to FIGS. 2 through 4, FIG. 2 shows energy barriers of an organic thin film transistor having a carrier relay layer with work function of 5.0 eV formed between the p-type organic semiconductor layer having a work function of 5.3 eV and the source and drain electrodes (for example, made of MoW) with a work function of 4.6 eV. In addition, FIG. 3 shows an energy band diagram of such organic thin film transistor and FIG. 4 shows energy barrier of an organic thin film transistor having the same structure as that of the above organic thin film transistor but without the carrier relay layer.

When a carrier relay layer is present, the relatively greater energy barrier (BL3) between the organic semiconductor layer and the source and drain electrodes shown in FIG. 4 is separated into the smaller energy barriers (BL1 and BL2) as illustrated in FIG. 2. Accordingly, as shown in FIG. 3, the organic thin film transistor having the carrier relay layer present can induce a cascade effect.

The carrier relay layers 23a and 23b can be made of conductive polymer material such as polyethylene dioxythiophene (PEDOT), polyaniline (PANI), etc. However, the present invention is not limited to the above and the carrier relay layer can be made of various other materials and still be within the scope of the present invention. In the present embodiment of FIG. 1, the carrier relay layers 23a and 23b made of a conductive polymer material are provided between the organic semiconductor layer 26 and each of the source electrode 21a and the drain electrode 21b to reduce contact resistance. In addition, since the carrier relay layers 23a and 23b of conductive polymer material are located between the source electrode 21a and the drain electrode 21b of inorganic material and the organic semiconductor layer 26 of organic material, the adhesiveness between the organic semiconductor layer 26 and the source electrode 21a and the drain electrode 21b is improved. It is preferable that the carrier relay layers 23a and 23b have a thickness of 10 Å to 100 Å and that they have a resistivity of $10^5$ Ωcm to $10^{14}$ Ωcm.

Because the carrier relay layers 23a and 23b are located between the source and drain electrodes 21a and 21b and the organic semiconductor layer 26, the carrier relay layers 23a and 23b determine the distance between the organic semiconductor layer 26 and each of the source and drain electrodes 21a and 21b. If the thickness of the carrier relay layers 23a and 23b is greater than 100 Å, since the distance between the source and drain electrodes 21a and 21b and the organic semiconductor layer 26 becomes great, there is a problem in that electrical conduction between them is not effective. If the thickness of the carrier relay layers 23a and 23b is less than 10 Å, there is a problem in that the carrier relay layers 23a and 23b can not properly function and they are not stably formed.

As the organic thin film transistor functions as a switching device or a driving device, a channel in the organic semiconductor layer 26 should be formed to communicate electric signals between the source electrode 21a and the drain electrode 21b only when a predetermined electrical signal is applied to the gate electrode 29. However, if the resistivity of the carrier relay layers 23a and 23b is less than $10^5$ Ωcm, when the carrier relay layer is integrally formed in the organic thin film transistor (see the first variation of the present embodiment), the electrical signal can be communicated between the source electrode and the drain electrode even though a channel is not formed in the organic semiconductor layer. That is, in the present invention, the resistivity of the carrier relay layers 23a and 23b should be equal to or greater than $10^5$ Ωcm so that electrical signals are not communicated between the source electrode 21a to the drain electrode 21b regardless of the shape of the carrier relay layers 23a and 23b. The details thereof will be further explained in the first variation of the present embodiment of FIG. 6. On the other hand, if the resistivity of the carrier relay layer 23a and 23b is greater than $10^{14}$ Ωcm, the electrical conduction from the source electrode 21a and the drain electrode 21b to the organic semiconductor layer 26 is not effective.

Accordingly, the range of the resistivity of the carrier relay layers 23a and 23b is within a range where the electrical conduction from the source electrode 21a to the drain electrode 21b does not occur when the transistor is turned off but the electrical conduction from the source electrode 21a and the drain electrode 21b via the organic semiconductor layer 26 readily occurs when the transistor is turned on.

In the present embodiment, the carrier relay layers 23a and 23b are patterned to correspond to one organic thin film transistor. That is, if a plurality of organic thin film transistors are provided, the carrier relay layers 23a and 23b of different transistors are separate from each other.

The carrier relay layers 23a and 23b can include a first carrier relay layer 23a located between the source electrode 21a and the organic semiconductor layer 26, and a second carrier relay layer 23b located between the drain electrode 21b and the organic semiconductor layer 26. The first carrier relay layer 23a is formed covering the entire portion of the exposed surface of the source electrode 21a, and the second carrier relay layer 23b is formed covering the entire portion of the exposed surface of the drain electrode 21b. Accordingly, the first carrier relay layer 23a and the second carrier relay layer 23b are spaced apart from each other.

In addition, the organic semiconductor layer 26 is a region where a channel is formed within when the transistor is turned on. If a plurality of organic thin film transistors are provided, the organic semiconductor layer 26 is patterned separately for each organic thin film transistor unit to prevent crosstalk between the adjacent thin film transistors. That is, the organic semiconductor layer 26 is insulated from the adjacent organic semiconductor layers (not shown).

The organic semiconductor layer 26 can be made of pentacene, tetracene, anthracene, naphthalene, flullerene, alpha-6-thiophene, alpha-4-thiophene, oligothiophene, perylene and its derivative, rubrene and its derivative, coronene and its derivative, perylene tetracarboxylic diimide and its derivative, perylene tetracarboxylic dianhydride and its derivative, polythiophene and its derivative, polyparaphenylenevinylene and its derivative, polyparaphenylene and its derivative, polyfluorene and its derivative, polythiophenevinylene and its derivative, polythiophene-heterocyclic aromatic copolymer and its derivative, oligoacene of naphthalene and its derivative, naphthalene tetra carboxylic acid diimide and its derivative, oligothiophene of alpha-5-thiophene and its derivative, phthalocyanines with or without metal and their derivatives, pyromellitic dianhydride and its derivative, pyromellitic diimide and its derivative, polyalkylthiophene, polythienylenevinylene, alkylfluorene unit, copolymer of alkylthiophene, etc. In the present embodiment, the organic semiconductor layer 26 can be made of p-type organic semiconductor material. However, the present invention is not limited thereto.

The gate insulating layer 27 can be made of an organic material such as benzocyclobutene (BCB), polyimide, polyvinylphenol, parylene, epoxy, polyvinyl chloride, CYPE, etc. In addition, the gate electrode 29 can be made of conductive metal such as MoW, Al, Cr, Al/Cr, etc., or a conductive polymer.

Turning now to FIGS. 5a to 5d, a manufacturing method of the organic thin film transistor of FIG. 1 will now be described. As the material for each element is the same as described above, the explanation of the same or similar elements will be omitted unless necessary. FIGS. 5a to 5d are cross sectional views of the organic thin film transistor to sequentially illustrate a manufacturing method thereof according to the first embodiment of the present invention.

Figure 5A:
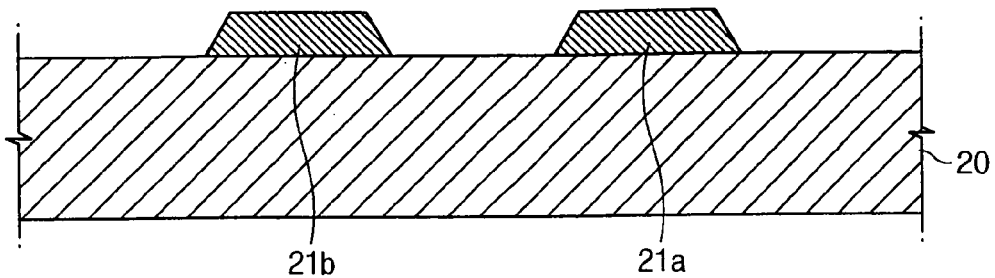
FIGS. 5a to 5d are cross sectional views of the organic thin film transistor to sequentially illustrate a manufacturing method of the organic thin film transistor of FIG. 1.

As shown in FIG. 5a, the source electrode 21a and the drain electrode 21b are formed on the substrate 20. The source electrode 21a and the drain electrode 21b can be formed by vapor depositing on the entire surface of the substrate 20 to form a conductive material layer and patterning the conductive material layer. Alternatively, the source electrode 21a and the drain electrode 21b can be formed by forming the conductive material layer in a predetermined pattern of the substrate 20 using a mask. Alternatively, the source and drain electrodes 21a and 21b can be formed by inkjet printing, etc.

Figure 5B:
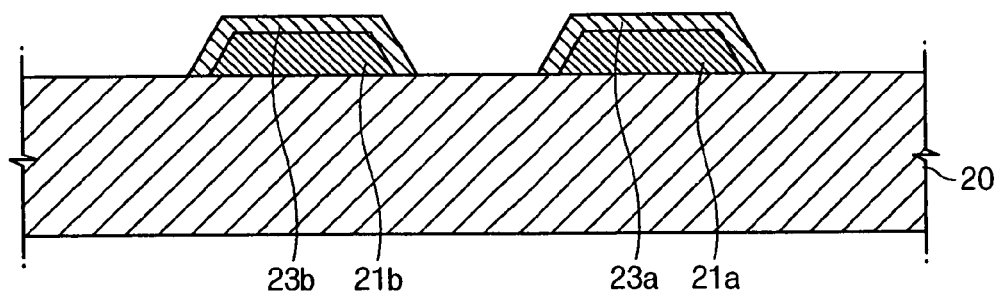

As shown in FIG. 5b, the first and the second carrier relay layers 23a and 23b are formed covering the entire portion of the exposed surface of the source electrode 21a and the drain electrode 21b. The first and the second carrier relay layers 23a and 23b can be formed by forming conductive polymer material layer of polyethylenedioxythiophene, polyaniline, etc. on the entire surface of the substrate 20 using spin coating, dipping or inkjet printing. The conductive polymer layer is then patterned using laser ablation technology (LAT). However, the present invention is not limited thereto.

Figure 5C:
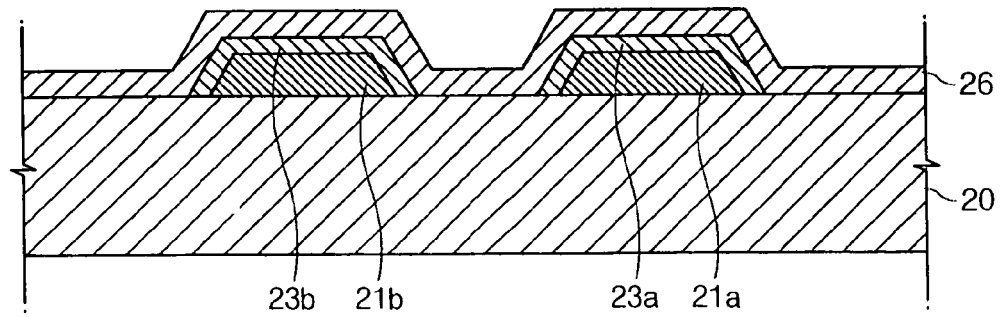

Turning now to FIG. 5c, the organic semiconductor material layer is vapor deposited on the entire surface of the substrate 20 to cover the carrier relay layers 23a and 23b. The organic semiconductor material layer is then patterned for each organic thin film transistor unit to form the organic semiconductor layer 26. The organic semiconductor material layer formed on the entire surface of the substrate 20 can be patterned by laser ablation technology. However, the present invention is not limited thereto.

Figure 5D:
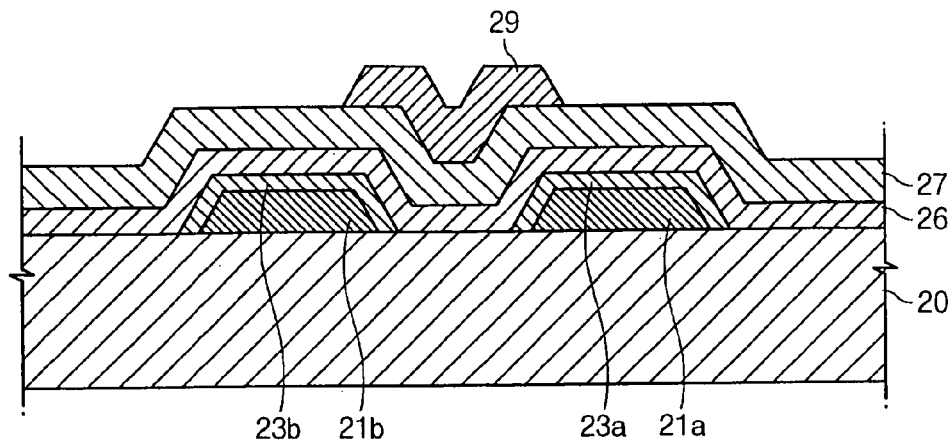

Turning now to FIG. 5d, the gate insulating layer 27 is formed by coating organic insulating material on the entire surface of the substrate 20. A gate electrode 29 is then formed on the gate insulating layer 27. The gate electrode 29 can be formed by vapor depositing on the entire surface of the substrate 20 to form a conductive layer, and then patterning it. Alternatively, the gate electrode 29 can be formed by forming the conductive material layer in a predetermined pattern of the substrate 20 using a mask. Alternatively, the gate electrode 29 can be formed by inkjet printing, etc.

Although it is described in the above that the carrier relay layers 23a and 23b are formed to cover an entire portion of the exposed surface of the source and drain electrodes 21a and 21b, the present invention is not limited thereto as the carrier relay layers 23a and 23b can be modified in various ways. Such variations will be described in detail with reference to FIGS. 6 to 9.

As the variations have the same basic structure as the organic thin film transistor of FIG. 1, the illustration of the same or similar elements will be omitted. That is, since the material and characteristics for each element have already been discussed above in conjunction with FIG. 1, the illustration thereof will be omitted when describing these variations of the organic thin film transistor of FIG. 1.

Figure 6:
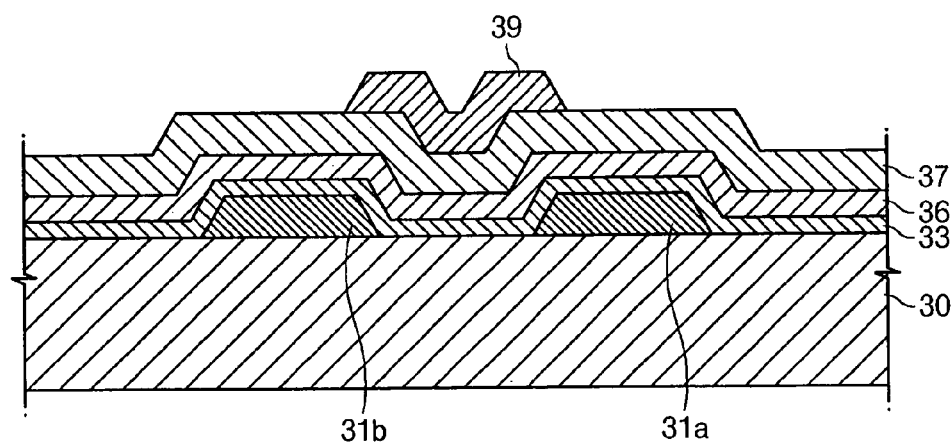
FIG. 6 is a cross sectional view of an organic thin film transistor according to the first variation of the first embodiment of the present invention.

Turning now to FIG. 6, FIG. 6 is a cross sectional view of an organic thin film transistor according to the first variation of the first embodiment of the present invention. With reference to FIG. 6, the carrier relay layer 33 is integrally formed on the substrate 30 between the source electrode 31a and the organic semiconductor layer 36, and between the drain electrode 31b and the organic semiconductor layer 36. The gate insulating layer 37 is formed covering the organic semiconductor layer 36, and the gate electrode 39 is formed thereon.

Then, although the carrier relay layer 33 is integrally formed, since the resistivity of the carrier relay layer 33 is equal to or greater than $10^5$ Ωcm, the problem of the electrical conduction from the source electrode 31a to the drain electrode 31b when the organic thin film transistor is turned off does not occur. Since the thickness of the carrier relay layer 33 is less than 100 Å, the distance between the organic semiconductor layer 36 and each of the source electrode 31a and the drain electrode 31b is small enough so that electrical conduction through carrier relay layer 33 readily occurs. In contrast, since the distance between the source electrode 31a and the drain electrode 31b is relatively large compared to the distance between the organic semiconductor layer 36 and each of the source and drain electrodes 31a and 31b and since the resistivity of the carrier relay layer 33 is at least $10^5$ Ωcm, the electrical conduction from the source electrode 31a to the drain electrode 31b does not occur when the organic thin film transistor is switched off.

In the organic thin film transistor of FIG. 6, it is possible that the carrier relay layer 33 is independently patterned for each of a plurality of the organic thin film transistors, or instead the carrier relay layer 33 can be integrally provided for a plurality of the organic thin film transistors. In the latter case, since the patterning process is omitted, the manufacturing process has an advantage in that the manufacturing process can be simplified.

Figure 7:
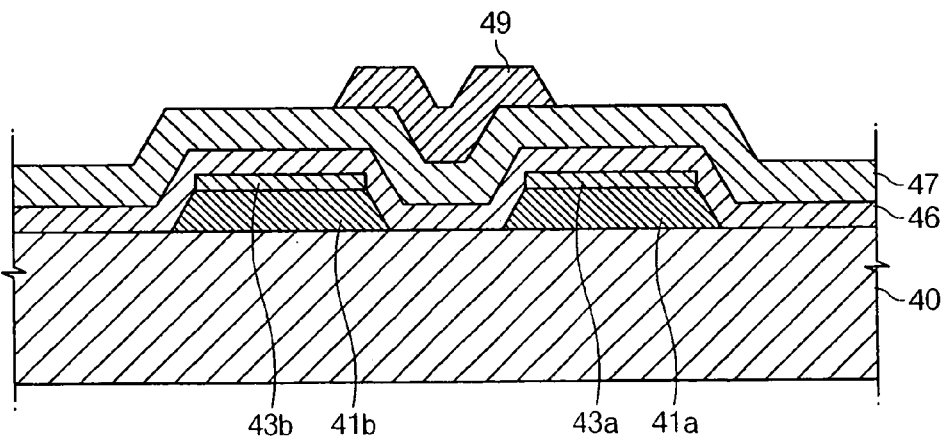
FIG. 7 is a cross sectional view of an organic thin film transistor according to the second variation of the first embodiment of the present invention.

Turning now to FIG. 7, FIG. 7 is a cross sectional view of an organic thin film transistor according to the second variation of the first embodiment of the present invention. With reference to FIG. 7, the first and second carrier relay layers 43a and 43b are formed only on the top surface of the source electrode 41a and the drain electrode 41b on the substrate 40, respectively. The organic semiconductor layer 46 and the gate insulating layer 47 are sequentially formed covering the carrier relay layers 43a and 43b, the substrate 40 and the edge portions of the source and drain electrodes 41a and 41b. The gate electrode 49 is then formed on the gate insulating layer 47.

Figure 8:
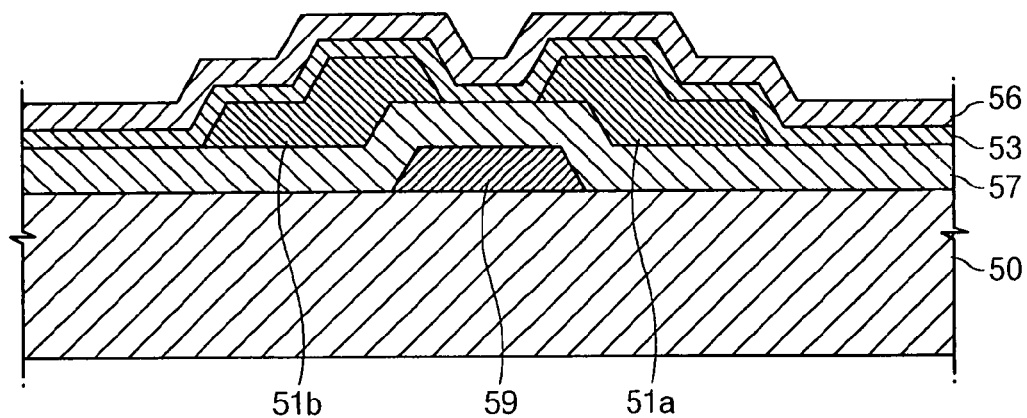
FIG. 8 is a cross sectional view of an organic thin film transistor according to the third variation of the first embodiment of the present invention.

Turning now to FIG. 8, FIG. 8 is a cross sectional view of an organic thin film transistor according to the third variation of the first embodiment of the present invention. With reference to FIG. 8, the gate electrode 59 is formed on the substrate 50 below the source and drain electrodes 51a and 51b, the carrier relay layer 53, the organic semiconductor layer 56 and the gate insulating layer 57. The gate insulating layer 57 is interposed between the gate electrode 59 and the source and drain electrodes 51a and 51b. Then, the source electrode 51a and the drain electrode 51b are formed below the organic semiconductor layer 56 and below the carrier relay layer 53. The carrier relay layer 53 is formed between the organic semiconductor layer 56 and the source and drain electrodes 51a and 51b.

In the present variation of FIG. 8, the gate insulating layer 57 contacts both the source and drain electrodes 51a and 51b. The source and drain electrodes 51a and 51b are made of one or more of Ti, Cr, Al, MoW, ITO, IZO, ZnO, $In_2O_3$, etc., each of which have good adhesiveness to the gate insulating layer 57. Accordingly, a separate adhesive layer is not needed between the gate insulating layer 57 and the source and drain electrodes 51a and 51b, thus simplifying the manufacturing process while avoiding the problem of deteriorating contact resistance caused by an adhesive layer.

Figure 9:
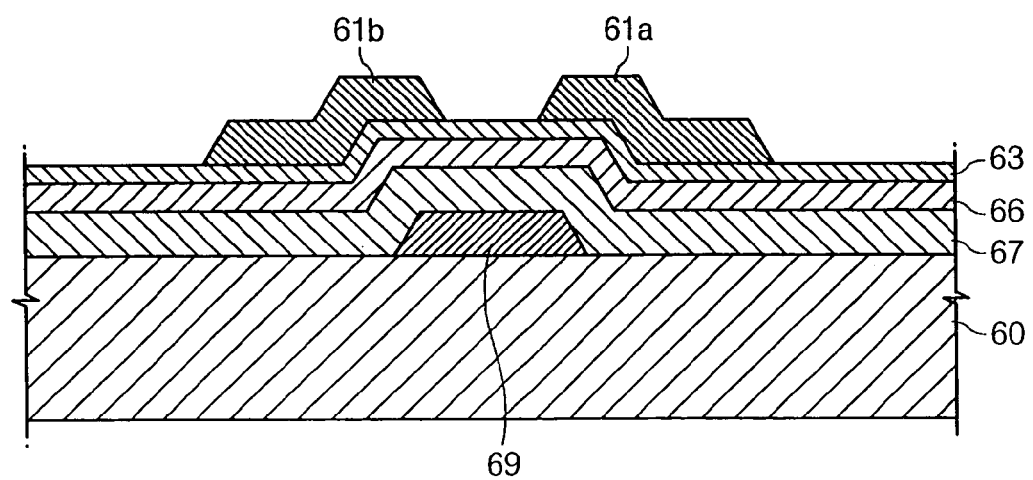
FIG. 9 is a cross sectional view of an organic thin film transistor according to the fourth variation of the first embodiment of the present invention.

Turning now to FIG. 9, FIG. 9 is a cross sectional view of an organic thin film transistor according to the fourth variation of the first embodiment of the present invention. With reference to FIG. 9, the gate electrode 69 is formed on the substrate 60 below the organic semiconductor layer 66, the carrier relay layer 63, and the source and drain electrodes 61a and 61b. A gate insulating layer 67 is interposed between the gate electrode 69 and each of the organic semiconductor layer 66, the carrier relay layer 63, and the source and drain electrodes 61a and 61b. The source electrode 61a and the drain electrode 61b are formed on carrier relay layer 63 which is formed on the organic semiconductor layer 66. The carrier relay layer 63 is formed between the organic semiconductor layer 66 and the source and drain electrodes 61a and 61b.

The manufacturing method of the organic thin film transistor according to the above variations is substantially the same as that of the organic thin film transistor according to the first embodiment, and is different only in its sequence and whether or not a layer is patterned, so the explanation thereof will omitted. In the meantime, the organic thin film transistor of the present invention described above can be used for a flat panel display device like an organic light emitting display device, etc., the details of which will be described in the following with reference to FIG. 10.

Figure 10:
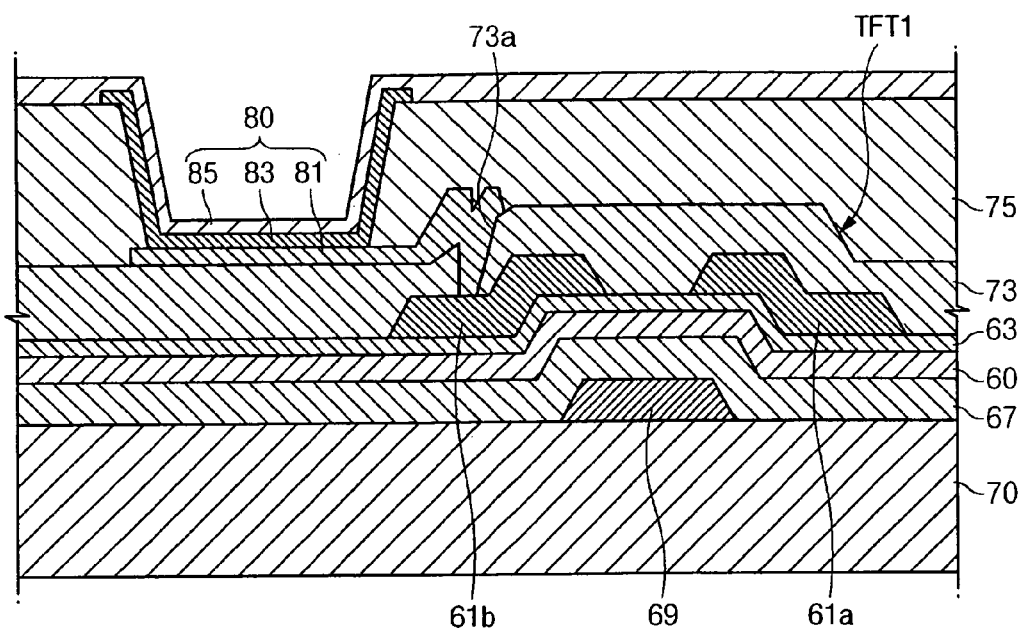
FIG. 10 is a schematic cross sectional view of a flat panel display device according to the first embodiment of the present invention employing the organic thin film transistor of FIG. 9.

FIG. 10 is a schematic cross sectional view of a flat panel display device according to the first embodiment of the present invention. As shown in FIG. 10, the organic thin film transistor (TFT1) is formed on the substrate 70. Although FIG. 10 shows the organic thin film transistor (TFT1) according to the fourth variation of FIG. 9, the present invention is not limited thereto.

As illustrated in FIG. 10, a passivation layer 73 made of $SiO_2$, etc. is formed on the organic thin film transistor (TFT1), and a pixel defining layer 75 made of acryl, polyimide, etc. is formed on the passivation layer 73. The passivation layer 73 can function as a protection layer for protecting the organic thin film transistor (TFT1), and it can also function as a flattening layer for flattening its top surface.

In addition, although not shown in FIG. 10, at least one capacitor can be connected to the organic thin film transistor (TFT1). Furthermore, a circuit including such organic thin film transistor (TFT1) is not limited only to the embodiment shown in FIG. 10, and it can be modified in various ways.

In FIG. 10, the drain electrode 61b is connected to a light emitting device 80 through a via hole 73a formed in the passivation layer 73. The light emitting device 80 includes a pixel electrode 81 and an opposite electrode 85 facing each other, and an intermediate layer 83 interposed between the pixel electrode 81 and the opposite electrode 85, the intermediate layer 83 having at least a light emitting layer. The opposite electrode 85 can be formed commonly with respect to a plurality of sub-pixels, and it can be modified in various ways.

Although FIG. 10 shows that the intermediate layer 83 is patterned to correspond only to the sub pixel, this illustration is for the convenience in explanation of the structure of the sub pixel. The intermediate layer 83 can instead be integrally formed with the intermediate layer of the adjacent sub pixel. In addition, the intermediate layer 83 can be modified in various ways such that some layer of the intermediate layer 83 is independently formed in each sub pixel, and the other layer is integrally formed with the intermediate layer of the adjacent sub pixel.

In FIG. 10, the pixel electrode 81 functions as an anode electrode, and the opposite electrode 85 functions as a cathode electrode. However, the polarity of the pixel electrode 81 and the opposite electrode 85 can be reversed. In addition, since the pixel electrode 81 and the drain electrode 61b are electrically connected to each other, they can be integrally formed.

The pixel electrode 81 can be provided as a transparent electrode or a reflection type electrode. If the pixel electrode 81 is a transparent electrode, it can be made of ITO, IZO, ZnO or $In_2O_3$. If the pixel electrode 81 is a reflection type electrode, it can include a first layer made of Ag, Mg, Al, Pt, Pd, Au, Ni, Nd, Ir, Cr or their mixture, and a second layer made of ITO, IZO, ZnO, $In_2O_3$, etc. and formed on the first layer.

The opposite electrode 85 can be also provided as a transparent electrode or a reflection type electrode. If the opposite electrode 85 is a transparent electrode, it can include a first layer made of Li, Ca, LiF/Ca, LiF/Al, Al, Mg, or a mixture thereof, and a second layer made of ITO, IZO, ZnO, $In_2O_3$, etc. and formed on the first layer. The second layer is formed as an auxiliary electrode or a bus electrode line. Alternatively, if the opposite electrode 85 is a reflection type electrode, it can be formed by vapor depositing Li, Ca, LiF/Ca, LiF/Al, Al, Mg, or their mixture on the entire surface.

The intermediate layer 83 located between the pixel electrode 81 and the opposite electrode 85 can include low molecular organic material or high molecular organic material. If the intermediate layer 83 is a low molecular organic material, it is formed by stacking a hole injection layer (HIL), a hole transport layer (HTL), an emission layer (EML), an electron transport layer (ETL), an electron injection layer (EIL), etc. in a single structure or in a composite structure. Copper phthalocyanine (CuPc), N,N'-Di(naphthalene-1-yl)-N,N'-diphenyl-benzidine (NPB), tris-8-hydroxyquinoline aluminum (Alq3), or the like can be used as the organic material. Such low molecular organic material can be formed by vapor depositing using masks.

If the intermediate layer 83 is a high molecular organic material, it generally has a hole transport layer (HTL) and an emission layer (EML). The hole transport layer (HTL) can include polyethylenedioxythiophene, and the emission layer (EML) can include polyphenylenevinylene type or polyfluorene type material.

Although the above discussion pertains to an organic light emitting display device, the present invention is not limited thereto, and the present invention can also apply to other flat panel display devices such as a liquid crystal display device, etc. In other words, the various designs for organic thin film transistors discussed in conjunction with FIGS. 1 and 6 through 9 can apply to other types of displays besides organic light emitting display devices and still be within the scope of the present invention. Since the organic thin film transistors described above can be manufactured in a flexible form, it can be used in various flat panel display devices to provide flexible characteristics. In particular, it is more useful when the material used for the flat panel display device is an organic material.

Figure 11:
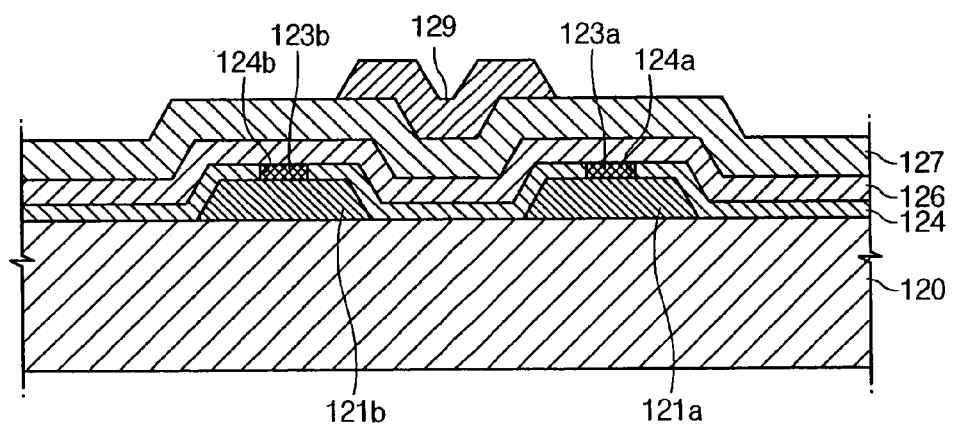
FIG. 11 is a cross sectional view of an organic thin film transistor according to the second embodiment of the present invention.

In the following, the organic thin film transistors and their manufacturing methods according to the second embodiment of the present invention and its variations will now be described. Turning now to FIG. 11, FIG. 11 is a cross sectional view of an organic thin film transistor according to the second embodiment of the present invention. As shown in FIG. 11, a source electrode 121a and a drain electrode 121b are formed on a substrate 120, and carrier relay layers 123a and 123b and a hydrophobic layer 124 are formed covering the source electrode 121a and the drain electrode 121b, and an organic semiconductor layer 126 is formed thereon. A gate insulating layer 127 is formed covering the organic semiconductor layer 126, and a gate electrode 129 is formed on the gate insulating layer 127 between the source electrode 121a and the drain electrode 121b.

The carrier relay layers 123a and 123b are formed on the same level as the hydrophobic layer 124 and fill in openings in the hydrophobic layer 124. In the present embodiment of FIG. 11, a first carrier relay layer 123a is formed on a portion of the top surface of the source electrode 121a between the organic semiconductor layer 126 and the source electrode 121a, and a second carrier relay layer 123b is formed on a portion of the top surface of the drain electrode 121b between the organic semiconductor layer 126 and the drain electrode 121b.

More specifically, in FIG. 11, the hydrophobic layer 124 has openings 124a and 124b corresponding to the top middle portion of the source electrode 121a and the drain electrode 121b, respectively, and the first and the second carrier relay layers 123a and 123b are formed in each of the openings 124a and 124b, respectively. That is, the first and the second carrier relay layers 123a and 123b are formed in the middle of the top surfaces of the source electrode 121a and the drain electrode 121b, respectively.

Then, it is preferable that conductive polymer material for the carrier relay layers 123a and 123b is not located between the source electrode 121a and the drain electrode 121b, considering a channel is formed between the source electrode 121a and the drain electrode 121b. Accordingly, in the present embodiment, the first and the second carrier relay layers 123a and 123b are formed on a portion of the top surface of the source electrode 121a and the drain electrode 121b, respectively.

The hydrophobic layer 124 can include a surface treatment agent containing a self-assembled monolayer having one to three of hydrophobic moiety, one to three of reactive halogen atoms or alkoxy moiety, and silane moiety. In particular, it is preferable that the hydrophobic layer 124 includes a surface treatment agent containing a hydrophobic self-assembled monolayer having trichlorosilanyl moiety or trialkoxysilanyl moiety at its terminal end. Such material can be octadecyl-trichlorosilane (OTC), etc.

In FIG. 11, the material for the substrate 120, the source electrode 121a, the drain electrode 121b, the first and the second carrier relay layers 123a and 123b, the organic semiconductor layer 126, the gate insulating layer 127 and the gate electrode 129 is the same as that of the elements corresponding to the first embodiment of FIGS. 1 and 6 through 9, and thus the details thereof will be omitted.

In the present embodiment of FIG. 11, since the first and the second carrier relay layers 123a and 123b are present, the organic semiconductor layer 126 and the source electrode 121a and the drain electrode 121b have an ohmic contact, and the contact resistance between the organic semiconductor layer 126 and the source electrode 121a and the drain electrode 121b can be reduced. The carrier relay layers 123a and 123b also enhance adhesiveness between the organic semiconductor layer 126 and each of the source electrode 121a and the drain electrode 121b.

In addition, in the present embodiment of FIG. 11, since the hydrophobic layer 124 is present, the carrier relay layers 123a and 123b can be formed only between the source electrode 121a and the organic semiconductor layer 126 and between the drain electrode 121b and the organic semiconductor layer 126. Accordingly, the hydrophobic layer 124 substantially prevents communicating unwanted electric signals between the source electrode 121a and the drain electrode 121b when the organic thin film transistor is turned off.

Turning now to FIGS. 12a to 12d, a manufacturing method of such organic thin film transistor of FIG. 11 will now be described. As the material for each element is the same as discussed in conjunction with FIG. 11, the explanation thereof will be omitted.

Figure 12A:
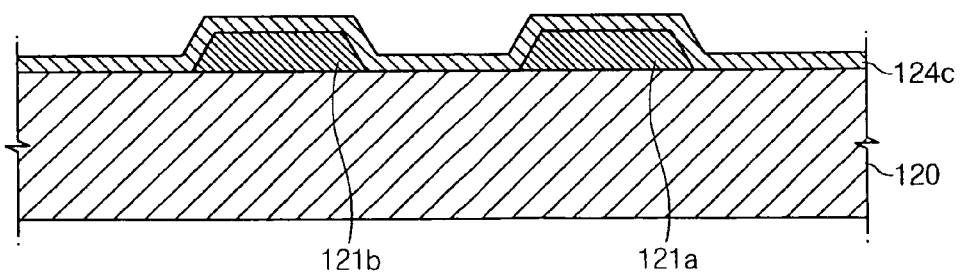
FIGS. 12a to 12d are cross sectional views of the organic thin film transistor to sequentially illustrate a manufacturing method of the organic thin film transistor of FIG. 11.

FIGS. 12a to 12d are cross sectional views of the organic thin film transistor to sequentially illustrate a manufacturing method thereof according to the second embodiment of the present invention. As shown in FIG. 12a, the source electrode 121a and the drain electrode 121b are formed on the substrate 120. A hydrophobic material layer 124c is formed on the entire surface of the substrate 120 to cover the source electrode 121a and the drain electrode 121b.

The source electrode 121a and the drain electrode 121b can be formed by vapor depositing on the entire surface of the substrate 120 to form a conductive layer and then patterning the conductive layer. Alternatively, the source electrode 121a and the drain electrode 121b can be formed by forming a patterned conductive layer on the substrate 120 using a mask. Alternatively, source electrode 121a and drain electrode 121b can be formed by inkjet printing, etc.

Figure 12B:
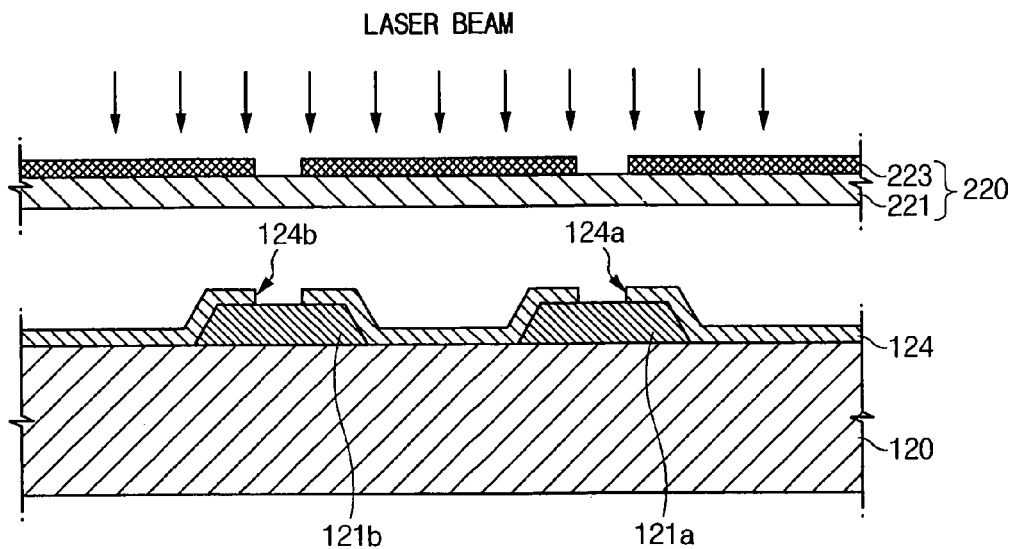

In addition, the hydrophobic material layer 124c can be formed by applying hydrophobic material on the entire surface of the substrate 120 using spin coating, dipping, etc. Then, as shown in FIG. 12b, the hydrophobic material layer 124c is patterned to become hydrophobic layer 124 by removing a portion of the hydrophobic material layer (124c in FIG. 12a) to expose a portion of the top surface of the source electrode 121a and a portion of the top surface of the drain electrode 121b. For example, in FIG. 12b, a laser beam is scanned to a portion of the hydrophobic material layer 124c using a mask 220 to form openings 124a and 124b. However, the present invention is not limited thereto. The mask 220, for example, has shielding material 223 in the form of a pattern to block the laser beam formed with the pattern on a transparent plate 221.

Figure 12C:
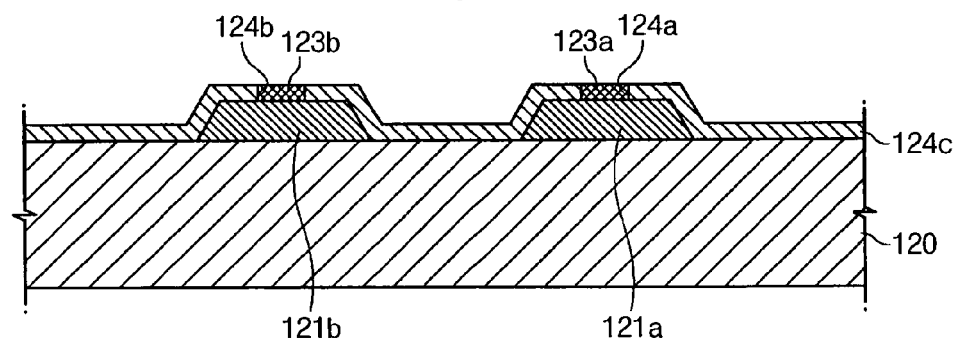

Then, as shown in FIG. 12c, the first and the second carrier relay layers 123a and 123b are formed by forming conductive polymer material layers to fill the openings 124a and 124b of the hydrophobic layer 124. Due to the characteristics of the hydrophobic layer 124, conductive polymer material layer cannot be formed on the hydrophobic layer 124, and accordingly, the first and the second carrier relay layers 123a and 123b are readily formed only in the openings 124a and 124b of the hydrophobic layer 124 without having to separately pattern the conductive polymer material in a separate process step. The first and the second carrier relay layers 123a and 123b can be formed by various methods, such as by inkjet printing, etc. In particular, dipping or spin coating processes are preferable because they can simplify the manufacturing process and shorten manufacturing time.

After completing the organic thin film transistor, a channel is formed between the source electrode 121a and the drain electrode 121b when the transistor is turned on. It is preferable that the conductive polymer material not be present between the source electrode 121a and the drain electrode 121b when the carrier relay layers 123a and 123b of the conductive polymer material layer are formed. When the hydrophobic layer 124 is present and the carrier relay layers 123a and 123b are, in general, not formed between the source electrode 121a and the drain electrode 121b. However, it is still possible that a small amount of the conductive polymer material can be remained despite the presence of hydrophobic layer 124. To remove this, a step of removing the conductive polymer material remaining between the source electrode 121a and the drain electrode 121b can be carried out in addition to the above steps. Removal of the unwanted conductive polymer material can be carried out, for example, by scanning laser beam, ultraviolet ray, or electron beam in the region between the source electrode 121a and the drain electrode 121b.

Figure 12D:
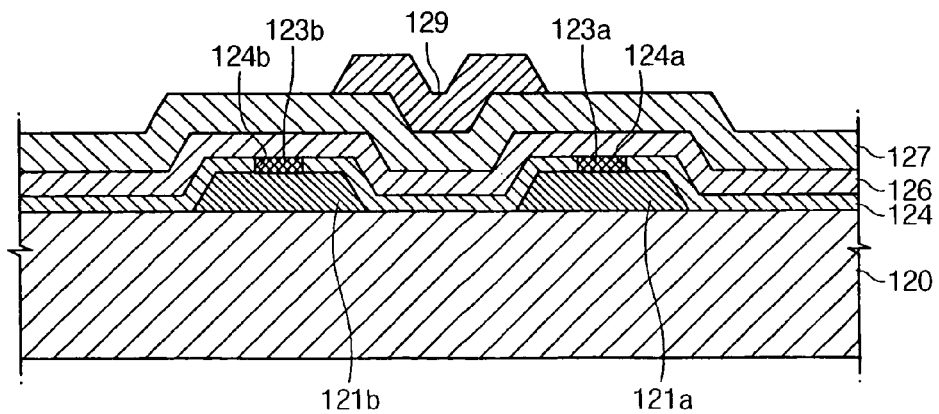

Then, as shown in FIG. 12d, the organic semiconductor layer 126 is formed, the gate insulating layer 127 is formed to cover the organic semiconductor layer 126, and the gate electrode 129 is formed on the gate insulating layer 127 to complete the organic thin film transistor of FIG. 11. The organic semiconductor layer 126 can be formed by various methods such as by inkjet printing, dipping, spin coating, etc. The manufacturing method of the organic thin film transistor according to FIGS. 12a through 12d has advantages in that it enables the carrier relay layers 123a and 123b to be readily formed, and accordingly, the organic thin film transistor of high quality can be manufactured with low cost.

Figure 13:
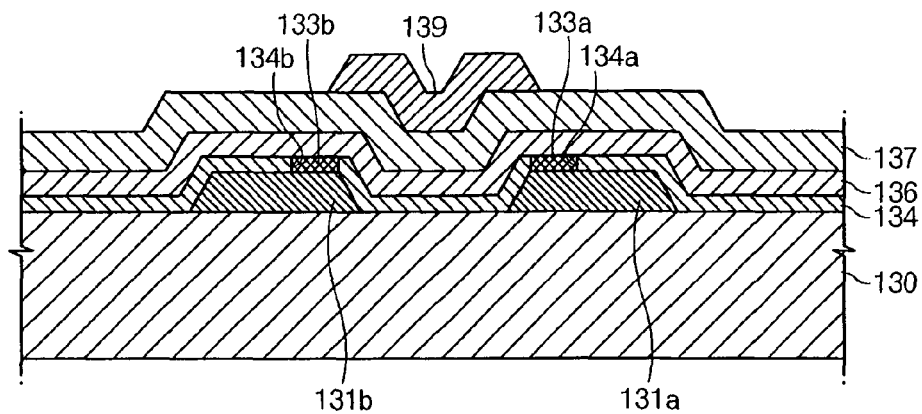
FIG. 13 is a cross sectional view of an organic thin film transistor according to the first variation of the second embodiment of the present invention.

Turning now to FIG. 13, FIG. 13 is a cross sectional view of an organic thin film transistor according to the first variation of the second embodiment of the present invention. As illustrated in FIG. 13, the first carrier relay layer 133a, located on a top surface of source electrode 131a, is formed on a portion of the top surface of source electrode 131a closest to the drain electrode 131b. Similarly, the second carrier relay layer 133b is located on a portion of the top surface of drain electrode 131b closest to source electrode 131a. This positioning is accomplished by forming opening 134a in the hydrophobic layer 134 on the source electrode 131a at an side of the top surface of source electrode 131a closest to drain electrode 131b. Likewise, opening 134b of the hydrophobic layer 134 formed on a side of the top surface of drain electrode 131b closest to the source electrode 131a. The first and the second carrier relay layers 133a and 133b are formed to fill these openings 134a and 134b.

Between the source electrode 131a and the drain electrode 131b, an electric signal is communicated through the channel formed in the organic semiconductor layer 136 according to a predetermined electric signal applied to the gate electrode 139. Considering this, the present embodiment forms the first and the second carrier relay layers 133a and 133b, which can facilitate transmitting the electric signals. Then, it is preferable that the source electrode 131a and the drain electrode 131b are electrically communicated with each other through the first and the second carrier relay layers 133a and 133b on the source electrode 131a and the drain electrode 131b when the transistor is turned on. The reference numeral 137 in FIG. 13 is the gate insulating layer.

Figure 14:
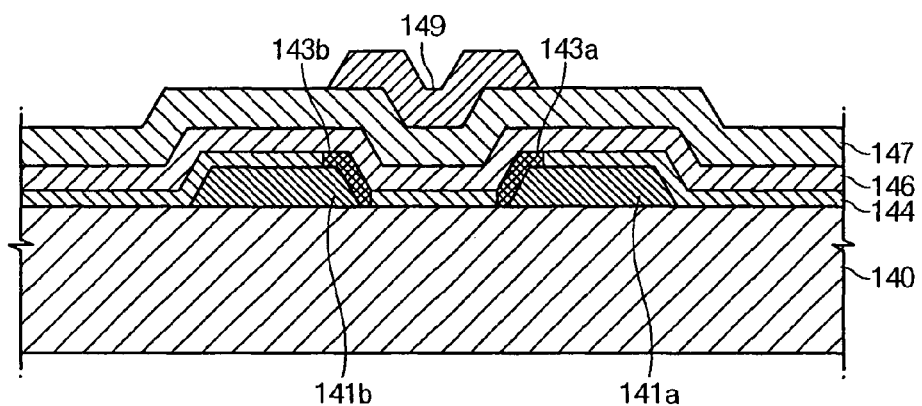
FIG. 14 is a cross sectional view of an organic thin film transistor according to the second variation of the second embodiment of the present invention.

Turning now to FIG. 14, FIG. 14 is a cross sectional view of an organic thin film transistor according to the second variation of the second embodiment of the present invention. With reference to FIG. 14, the first carrier relay layer 143a is formed to cover the end or sidewall surface of the source electrode 141a that faces drain electrode 141b, and the second carrier relay layer 143b is formed to cover the end or sidewall surface of the drain electrode 141b that faces source electrode 141a. Accordingly, the electric signal between the source electrode 141a and the drain electrode 141b can be communicated through the first and the second carrier relay layers 143a and 143b. The organic semiconductor layer 146, the gate insulating layer 147 and the gate electrode 149 are sequentially formed on the carrier relay layers 143a and 143b.

Figure 15:
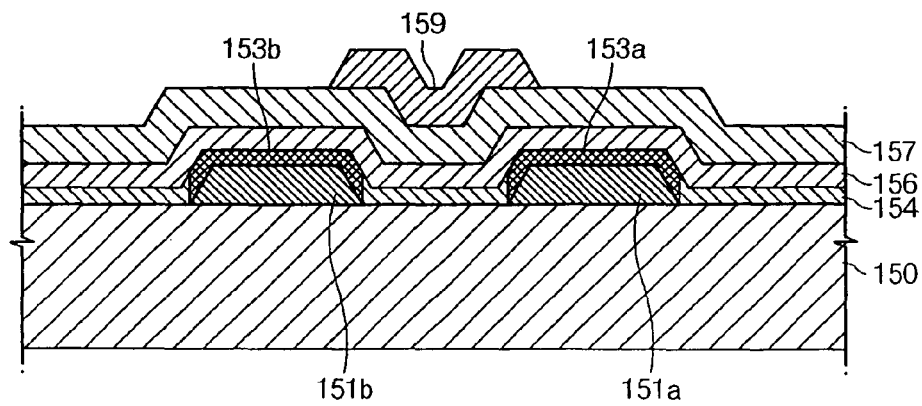
FIG. 15 is a cross sectional view of an organic thin film transistor according to the third variation of the second embodiment of the present invention.

Turning now to FIG. 15, FIG. 15 is a cross sectional view of an organic thin film transistor according to the third variation of the second embodiment of the present invention. With reference to FIG. 15, the first and the second carrier relay layers 153a and 153b are formed to cover the entire top and side surfaces of the source electrode 151a and the drain electrode 151b respectively. The first and the second carrier relay layers 153a and 153b are formed in openings in the hydrophobic layer 154. The organic semiconductor layer 156, the gate insulating layer 157 and the gate electrode 159 are sequentially formed on the carrier relay layers 153a and 153b.

The manufacturing method of the organic thin film transistor according to the first to the third variations of the second embodiment (FIGS. 13 through 15) is substantially the same as that of the organic thin film transistor according to the non-variant version of the second embodiment (FIGS. 11 through 12d), and is different only in the location where the opening in the hydrophobic layer is formed, so the explanation thereof is omitted.

Figure 16:
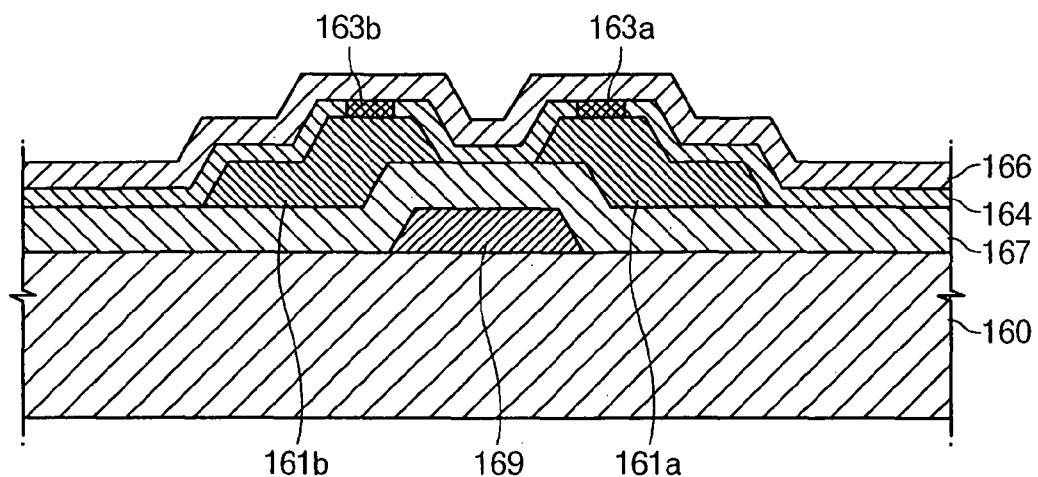
FIG. 16 is a cross sectional view of an organic thin film transistor according to the fourth variation of the second embodiment of the present invention.

Turning now to FIG. 16, FIG. 16 is a cross sectional view of an organic thin film transistor according to the fourth variation of the second embodiment of the present invention. With reference to FIG. 16, the gate electrode 169 formed on the substrate 160 and is formed below the source electrode 161a, the drain electrode 161b, the carrier relay layers 163a and 163b, the hydrophobic layer 164, and the organic semiconductor layer 166, and the gate insulating layer 167. Gate insulating layer 167 is formed between the gate electrode 169 and the source electrode 161a, the drain electrode 161b, the carrier relay layers 163a and 163b, the hydrophobic layer 164, and the organic semiconductor layer 166. The source electrode 161a and the drain electrode 161b are formed below the organic semiconductor layer 166. The carrier relay layers 163a and 163b are formed between the organic semiconductor layer 166 and the source electrode 161a and the drain electrode 161b.

In FIG. 16, the source and drain electrodes 161a and 161b and the gate insulating layer 167 contact each other, and the source and drain electrodes 161a and 161b are made of Ti, Cr, Al, MoW, ITO, IZO, ZnO, $In_2O_3$, etc. which have good adhesiveness to the gate insulating layer 167. Accordingly, a separate adhesive layer is not needed between the gate insulating layer 167 and the source and drain electrodes 161a and 161b, resulting in a simplified and less expensive method of making while preventing deterioration of contact resistance characteristics caused by the presence of an adhesive layer.

Turning now to FIGS. 17a to 17d, a manufacturing method of the organic thin film transistor of FIG. 16 will now be described. As the material for each element is the same as the above, the explanation thereof will be omitted.

Figure 17A:
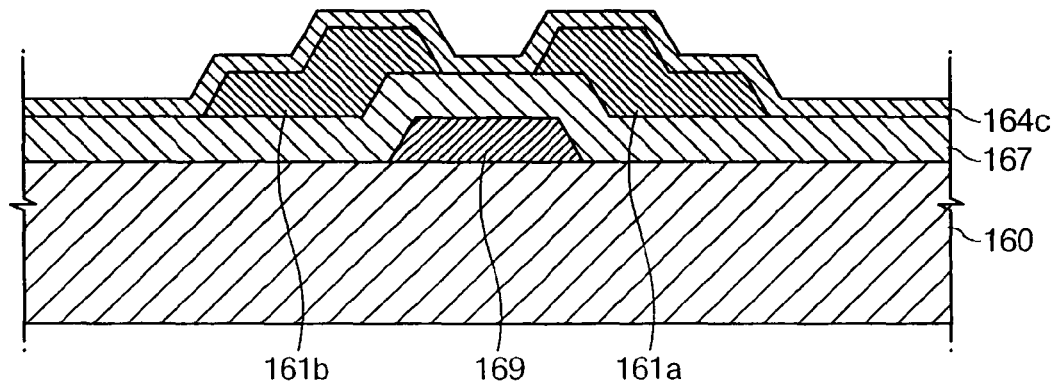
FIGS. 17a to 17d are cross sectional views of the organic thin film transistor to sequentially illustrate a manufacturing method of the organic thin film transistor of FIG. 16.

FIGS. 17a to 17d are cross sectional views of the organic thin film transistor to sequentially illustrate a manufacturing method thereof according to the fourth variation of the second embodiment of the present invention. As shown in FIG. 17a, the gate electrode 169, the gate insulating layer 167, the source electrode 161a and the drain electrode 161b are sequentially formed on the substrate 160. The hydrophobic material layer 164c is formed on the entire surface of the substrate 160 to cover the source electrode 161a and the drain electrode 161b.

Figure 17B:
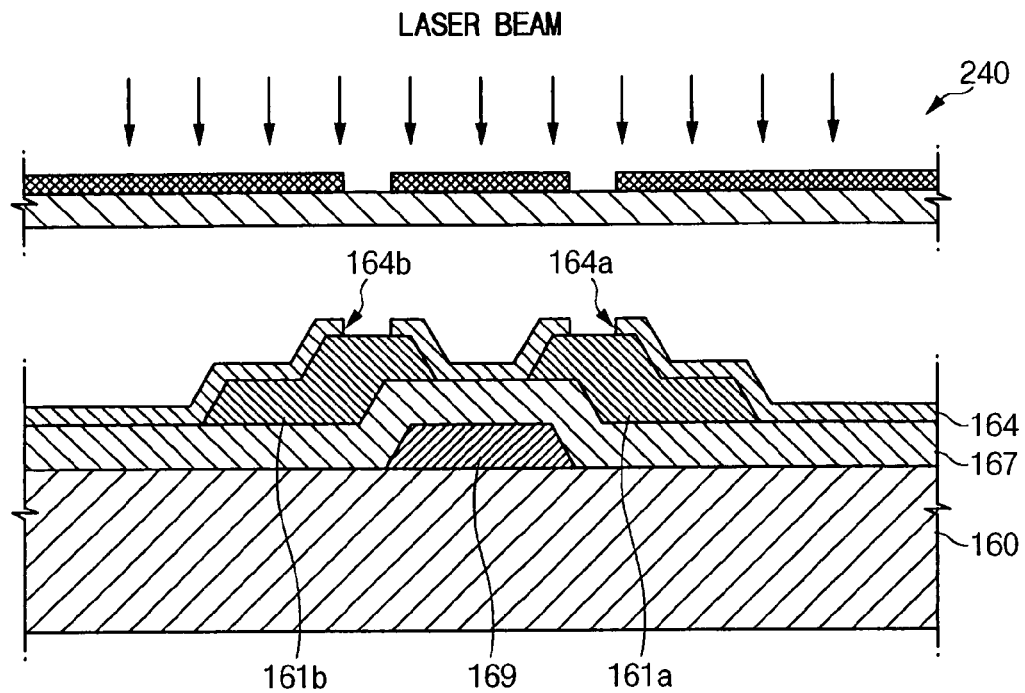
Figure 17C:
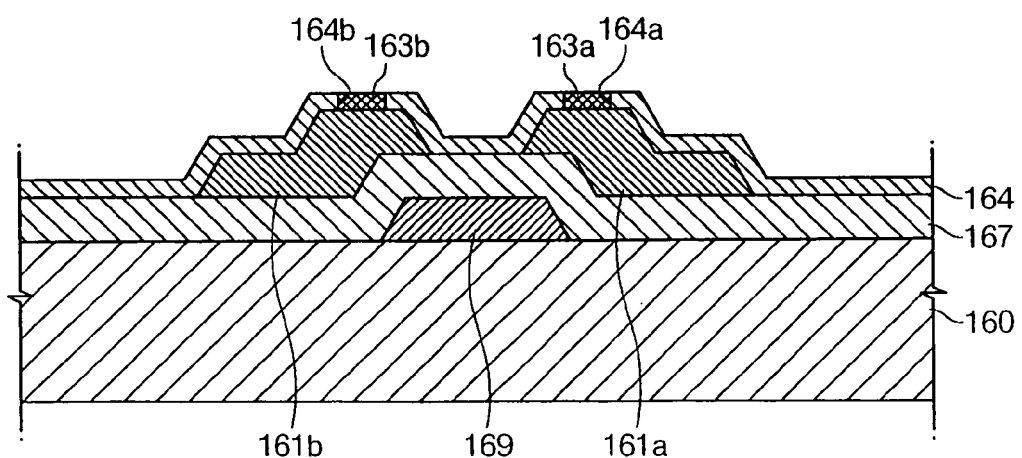
Figure 17D:
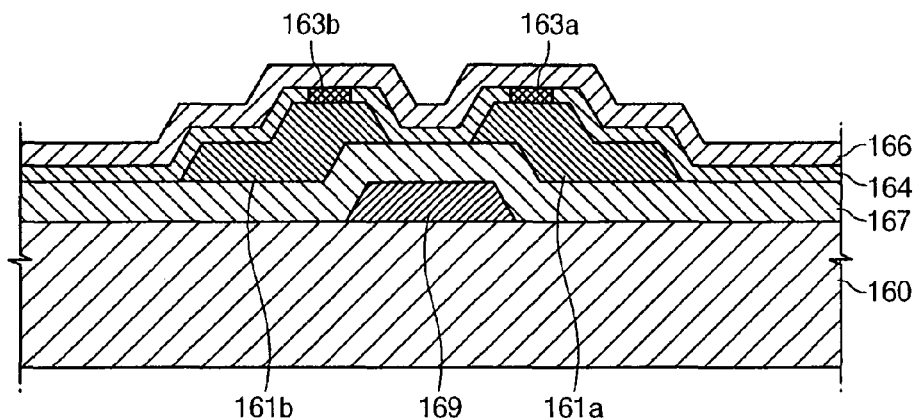

Then, as shown in FIG. 17b, a portion of the hydrophobic material layer (164c in FIG. 17a) is removed by various ways such as scanning laser beam with a mask 240, etc. to expose a portion of the top surface of each of the source electrode 161a and the drain electrode 161b. Accordingly, the hydrophobic layer 164 is formed to have openings 164a and 164b exposing a portion of the top surface of the source electrode 161a and a portion of the top surface of the drain electrode 161b. Then, as shown in FIG. 17c, the first and the second carrier relay layers 163a and 163b are formed to fill the openings 164a and 164b of the hydrophobic layer 164. Then, as shown in FIG. 17d, the organic semiconductor layer 166 is applied on top of hydrophobic layer 164, and on top of first and second carrier relay layers 163a and 163b to complete the organic thin film transistor of FIG. 16. The manufacturing method of the organic thin film transistor according to FIGS. 17a through 17d has advantages in that it enables the carrier relay layers 163a and 163b to be readily formed, and accordingly, the organic thin film transistor of high quality can be manufactured with low cost.

Figure 18:
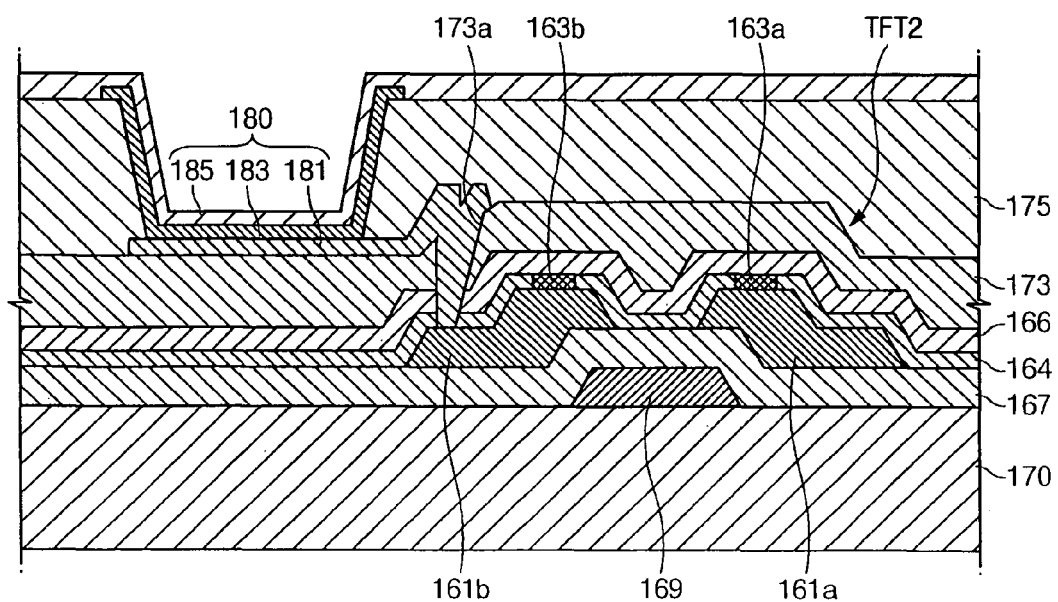
FIG. 18 is a schematic cross sectional view of a flat panel display device according to the second embodiment of the present invention employing the organic thin film transistor of FIG. 16.

Turning now to FIG. 18, FIG. 18 is a schematic cross sectional view of a flat panel display device according to the second embodiment of the present invention employing the organic thin film transistor of FIG. 16. With reference to FIG. 18, a buffer layer (not shown) made of $SiO_2$ can be formed on the substrate 170, if necessary, and as described in the above, and then the organic thin film transistor (TFT2) is formed thereon. Although FIG. 18 shows, as an example, the organic thin film transistor (TFT2) according to the fourth variation among the second embodiment (FIG. 16), the present invention is not limited thereto.

A passivation layer 173 is formed on the organic thin film transistor TFT2, and a pixel defining layer 175 made of acryl, polyimide, etc. is formed on the passivation layer 173. The drain electrode 161b is connected to the light emitting device 180 through a via hole 173a formed in the passivation layer 173. The light emitting device 180 includes a pixel electrode 181 and an opposite electrode 185, and an intermediate layer 183 interposed between the pixel electrode 181 and the opposite electrode 185, the intermediate layer 183 having at least a light emitting layer. As the display of FIG. 18 has the same basic structure as the flat panel display device of the first embodiment of FIG. 10, the details thereof will be omitted.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A method of manufacturing an organic thin film transistor, comprising:
   forming a hydrophobic material layer on an entire surface of a substrate;
   forming at least one opening in the hydrophobic material layer; and
   forming a carrier relay layer in the at least one opening, the carrier relay layer being arranged at least between an organic semiconductor layer and a source electrode or between the organic semiconductor layer and a drain electrode, the carrier relay layer comprising a conductive polymer material.

2. The method of claim 1, wherein the hydrophobic material layer is produced by a process selected from the group consisting of spin coating and dipping.

3. The method of claim 1, wherein the at least one opening in the hydrophobic material layer is produced by a laser beam scanning process.

4. The method of claim 1, further comprising removing remaining conductive polymer material from between the source electrode and the drain electrode after the forming the carrier relay layer in the opening.

5. The method of claim 4, wherein the removing of the remaining conductive polymer material from between the source electrode and the drain electrode is achieved by a process selected from the group consisting of laser beam, ultraviolet ray, or electron beam scanning.

6. The method of claim 1, further comprising:
  forming the source and drain electrodes on the substrate before the formation of the hydrophobic material layer; and
  forming the organic semiconductor layer on the carrier relay layer and on the hydrophobic material layer.

7. The method of claim 6, further comprising forming a gate electrode after the formation of the organic semiconductor layer.

8. The method of claim 6, further comprising forming a gate electrode before the formation of the source and drain electrodes.

9. The method of claim 1, wherein the at least one opening comprises an opening being arranged only at a center of a top surface of each of the source and drain electrodes.

10. The method of claim 1, wherein the at least one opening comprises an opening being arranged at a portion of a top surface of the drain electrode closest to the source electrode and a portion of a top surface of the source electrode closest to the drain electrode.

11. The method of claim 1, wherein the at least one opening comprises an opening being arranged on a sidewall surface of the drain electrode that faces the source electrode and on a sidewall surface of the source electrode that faces the drain electrode.

12. The method of claim 1, wherein the at least one opening comprises an opening being arranged over an entirety of the top and side surfaces of each of the source and drain electrodes.

* * * * *